United States Patent [19]

Proebsting

[11] Patent Number: 5,585,747
[45] Date of Patent: Dec. 17, 1996

[54] HIGH SPEED LOW POWER SENSE AMPLIFIER

[76] Inventor: Robert J. Proebsting, 27800 Edgerton Rd., Los Altos Hills, Calif. 94022

[21] Appl. No.: 321,390

[22] Filed: Oct. 11, 1994

[51] Int. Cl.⁶ .................................................. G01R 19/00
[52] U.S. Cl. ......................... 327/55; 327/51; 365/189.11
[58] Field of Search .................................. 327/51, 52, 53, 327/54, 55; 326/112; 365/189.01, 189.02, 189.03, 189.04, 189.05, 203, 204, 205, 206, 230.01, 230.02

[56] References Cited

U.S. PATENT DOCUMENTS

| | | | |
|---|---|---|---|
| 4,910,713 | 3/1990 | Madden et al. | 365/189.11 |
| 4,982,363 | 1/1991 | Sood | 365/189.01 |
| 4,984,207 | 1/1991 | Tateno et al. | 365/208 |
| 5,162,681 | 11/1992 | Lee | 307/530 |
| 5,231,318 | 7/1993 | Reddy | 327/52 |
| 5,325,335 | 6/1994 | Ang et al. | 365/205 |
| 5,341,333 | 8/1994 | Tien et al. | 365/189.06 |
| 5,384,504 | 1/1995 | Dickinson et al. | 327/51 |
| 5,392,243 | 2/1995 | Nakamura | 365/190 |
| 5,394,037 | 2/1995 | Josephson et al. | 327/51 |

FOREIGN PATENT DOCUMENTS

| | | | |
|---|---|---|---|
| 0306712 | 3/1989 | European Pat. Off. | G11C 7/06 |
| 0400724 | 5/1990 | European Pat. Off. | G11C 7/06 |

*Primary Examiner*—John S. Heyman
*Assistant Examiner*—Kenneth B. Wells
*Attorney, Agent, or Firm*—Townsend and Townsend and Crew LLP

[57] ABSTRACT

A differential sense amplifier is provided wherein a first amplifier stage is biased to minimize current consumption of all stages of the amplifier and to provide outputs of the first stage that are high enough in voltage to allow proper operation of a second stage of the amplifier, yet low enough in voltage to allow a current mirror to be integrated into the second stage of the amplifier. The integration of the third stage current mirror into the second stage amplifier reduces capacitive loading on the outputs of the second stage increasing speed while eliminating the extra power normally associated with a separate current mirror. This combination results in a very fast, yet very low power amplifier.

39 Claims, 2 Drawing Sheets

HIGH SPEED LOW POWER SENSE AMPLIFIER

BACKGROUND OF THE INVENTION

The present invention relates to electronic circuitry used in semiconductor devices. More particularly, the invention relates to a static sense amplifier circuit for sensing the differential voltages on two input lines and producing a digital output signal indicative of the relationship of the voltages on the two input lines.

Sense amplifiers are commonly used in many electronic circuits. A typical differential sense amplifier receives first and second input signals and generates an output signal indicative of a relationship between the two input signals. For example, an output signal of first potential may be generated to indicate that the first input signal has a higher potential than the second input signal. An output signal of different potential may be generated to indicate that the first input signal has a lower potential than the second input signal.

One problem encountered in some known sense amplifiers is caused by a combination of the circuitry and the characteristics of the transistors used to construct the sense amplifier. If field effect transistors are used, the gate capacitance presented at the input of an amplifier stage normally adds substantial delay to the preceding amplifier stage, slowing down the response of the circuit. Another problem with some known sense amplifiers is excessive power consumption. Yet another problem in some sense amplifiers is extreme sensitivity to process variations. In view of the foregoing problems, there is a need to provide a sense amplifier that provides a combination of high speed, low power consumption, and process tolerance.

SUMMARY OF THE INVENTION

The present invention provides a high-speed, highly reliable, static, differential sense amplifier which consumes less power for a given speed than known sense amplifiers. In one embodiment of the present invention, a first NMOS transistor receives a first input signal at its gate terminal, a second NMOS transistor receives a second input signal at its gate terminal, and the drain terminals of the first and second transistors are coupled to a positive supply voltage. The source terminals of the first and second transistors are coupled to the drain terminals of cross-coupled third and fourth NMOS transistors, respectively. That is, the third transistor gate is cross-coupled to the fourth transistor drain, and the fourth transistor gate is cross-coupled to the third transistor drain. The first and second transistors are matched to each other in all characteristics including size, as are the third and fourth transistors. The width-to-length ratio of the first and the second transistors is greater than that of the third and fourth transistors to prevent the circuit from locking into one state. The source terminals of the third and fourth transistors are connected together and also connected to both the gate and drain terminals of a fifth NMOS transistor. The source terminal of the fifth NMOS transistor is connected to a negative supply. The function of the fifth transistor is twofold. It limits the gate to source voltages of transistors 1 through 4 to limit their current consumption. It further insures that the outputs of the first amplifier stage are high enough in voltage for a second amplifier stage to operate properly.

The first, second, third, fourth, and fifth transistors form a first stage of a sense amplifier which is coupled to a second stage. The second stage includes four additional transistors connected in the same manner as the first, second, third and fourth transistors. Finally, a transistor used to form a current mirror for producing the output signal at the output of a third amplifier stage (current mirror stage) is incorporated into the second stage of the amplifier, eliminating the need for a separate power-consuming current mirror stage.

DETAILED DESCRIPTION OF THE PREFERRED EMBODIMENTS

Figure 1:
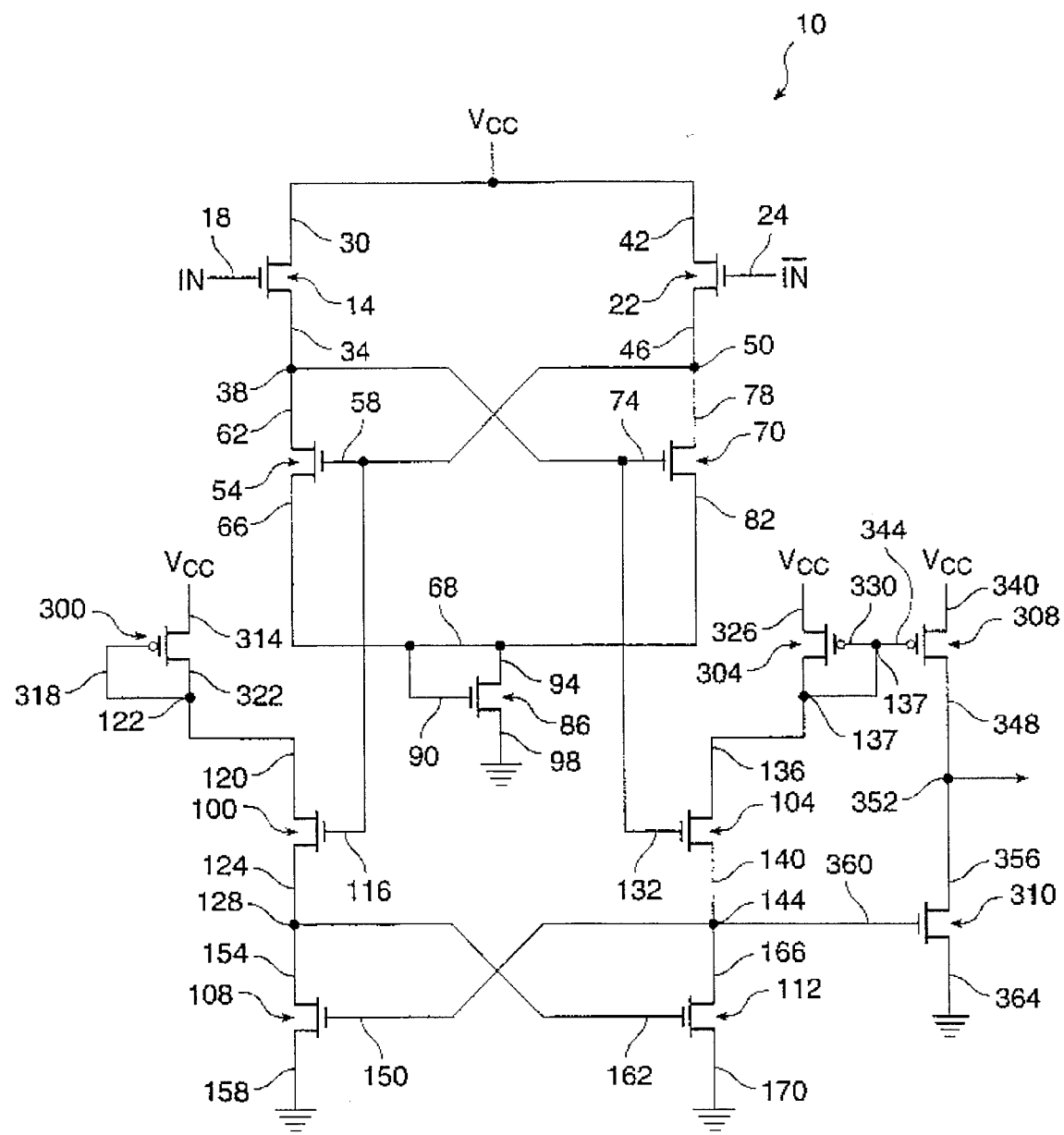
FIG. 1 is a schematic diagram of a preferred embodiment of a sense amplifier according to the present invention.

FIG. 1 is a schematic diagram of a preferred embodiment of a sense amplifier 10 according to the present invention. Sense amplifier 10 includes an NMOS transistor 14 having a gate terminal 18 for receiving a first input signal IN and an NMOS transistor 22 having a gate terminal 24 for receiving a second input signal, $\overline{IN}$. In the preferred embodiment, all the transistors have the shortest channel length the technology will allow. NMOS transistors 14 and 22 preferably are identical in length and width, with a reasonable width being 9 microns. Of course, other sizes may be used; however, to more clearly explain the invention, certain exemplary sizes are discussed below with the understanding other sizes may be used. The IN and $\overline{IN}$ signals may comprise any differential signals near the positive supply voltage. For example, they may comprise the true and complement bit lines of a static RAM or the true and complement I/O lines of a dynamic RAM. Typically the input signals will be such that one input signal changes from a selected potential to a slightly lower potential while the other input signal changes from the slightly lower potential (or approximately the slightly lower potential) to the selected potential. NMOS transistor 14 has a first terminal 30 coupled to a power supply voltage $V_{cc}$ and a second terminal 34 coupled to a node 38. Similarly, NMOS transistor 22 has a first terminal 42 coupled to the power supply voltage $V_{cc}$ and a second terminal 46 coupled to a node 50.

NMOS transistor 54 has a gate terminal 58 coupled to node 50, a first terminal 62 coupled to node 38, and a second terminal 66 coupled to a node 68. Another NMOS transistor 70 has a gate terminal 74 coupled to node 38, a first terminal 78 coupled to node 50, and a second terminal 82 coupled to node 68. Transistor 54 is preferably two-thirds the width of transistor 14, and transistor 70 is preferably two-thirds the width of transistor 22. That is, transistors 54 and 70 are preferably each 6 microns wide for the 9 micron assumed width of transistors 14 and 22. An NMOS transistor 86 has a gate terminal 90 and a first terminal 94 both coupled to node 68, and a second terminal 98 coupled to ground potential. Preferably, NMOS transistor 86 is about as wide as the sum of the widths of NMOS transistors 54 and 70 (e.g., 12 microns wide). NMOS transistors 14, 22, 54, 70, and 86 together form a first stage of sense amplifier 10, with differential outputs on nodes 38 and 50. Note that since all these transistors are NMOS, this amplifier stage functionality is independent of PMOS characteristics, making the circuit very process tolerant. In one very useful application, IN and $\overline{\text{IN}}$ are connected to true and complementary bit lines, respectively, of a static RAM, with either IN or $\overline{\text{IN}}$ at $V_{cc}$ potential and the other input, $\overline{\text{IN}}$ or IN, a few hundred millivolts below the $V_{cc}$ potential. For this case, it is helpful to consider the common mode voltages at various nodes with both IN and $\overline{\text{IN}}$ at the $V_{cc}$ potential.

When there is no differential voltage between the input signals to the first stage of the amplifier, IN and $\overline{\text{IN}}$, there is also no differential voltage between the output signals from this first stage, nodes 38 and 50. That is, nodes 38 and 50 are at the same voltage. Note that the sum of the widths of transistors 14 and 22 (effectively in parallel for common mode analysis since nodes 38 and 50 are at the same voltage, as are IN and $\overline{\text{IN}}$) is only slightly larger than the sum of the widths of transistors 54 and 70 (also effectively in parallel), which in turn is equal to the width of transistor 86. This causes the voltage on node 68 to be about one-third of $V_{cc}$ (ground being 0 volts) and the common voltage on nodes 38 and 50 to be about two-thirds of $V_{cc}$. Note that the drain-to-source voltage as well as the gate-to-source voltage of each of the transistors 14, 22, 54, 70, and 86 is about one-third of $V_{cc}$. If transistor 86 were not included, but instead node 68 were connected directly to ground, two problems would arise. First, power consumption of this first stage of amplifier would rise significantly, because each remaining transistor would have a drain-to-source and gate-to-source voltage of about one-half $V_{cc}$ rather than only one-third $V_{cc}$. And secondly, the quiescent bias condition of only one-half $V_{cc}$ on the output of the first stage of the amplifier may be insufficient for proper operation of the second stage of the amplifier.

The outputs of the first stage of sense amplifier 10 are coupled to the inputs of a second stage which includes NMOS transistors 100, 104, 108, and 112. NMOS transistor 100, which in the preferred embodiment is 9 microns wide, has a gate terminal 116 coupled to gate terminal 58 of transistor 54 (and to node 50), a first terminal 120 coupled to a node 122 and a second terminal 124 coupled to a node 128. NMOS transistor 104, also preferably 9 microns wide, has a gate terminal 132 coupled to gate terminal 74 of NMOS transistor 70 (and to node 38), a first terminal 136 coupled to a node 137 and a second terminal 140 coupled to a node 144. NMOS transistor 108, preferably two-thirds the width of NMOS transistor 100, or 6 microns wide, has a gate terminal 150 coupled to node 144, a first terminal 154 coupled to node 128 and a second terminal 158 coupled to a ground potential. NMOS transistor 112, preferably two-thirds the width of NMOS transistor 104, or 6 microns wide, has a gate terminal 162 coupled to node 128, a first terminal 166 coupled to node 144, and a second terminal 170 coupled to a ground potential. NMOS transistors 100, 104, 108 and 112 are cross coupled in the same manner as NMOS transistors 14, 22, 54 and 70. The common mode voltage on nodes 128 and 144 is approximately half the common mode voltage on nodes 38 and 50, that is, approximately one-third $V_{cc}$. In prior art circuits, the first terminal of transistors 100 and 104 typically would be connected to the positive supply, $V_{cc}$, but in the teachings of this invention, the current through NMOS transistor 112 also goes through current-mirror PMOS transistor 304 whose function will be described later.

Figure 3:
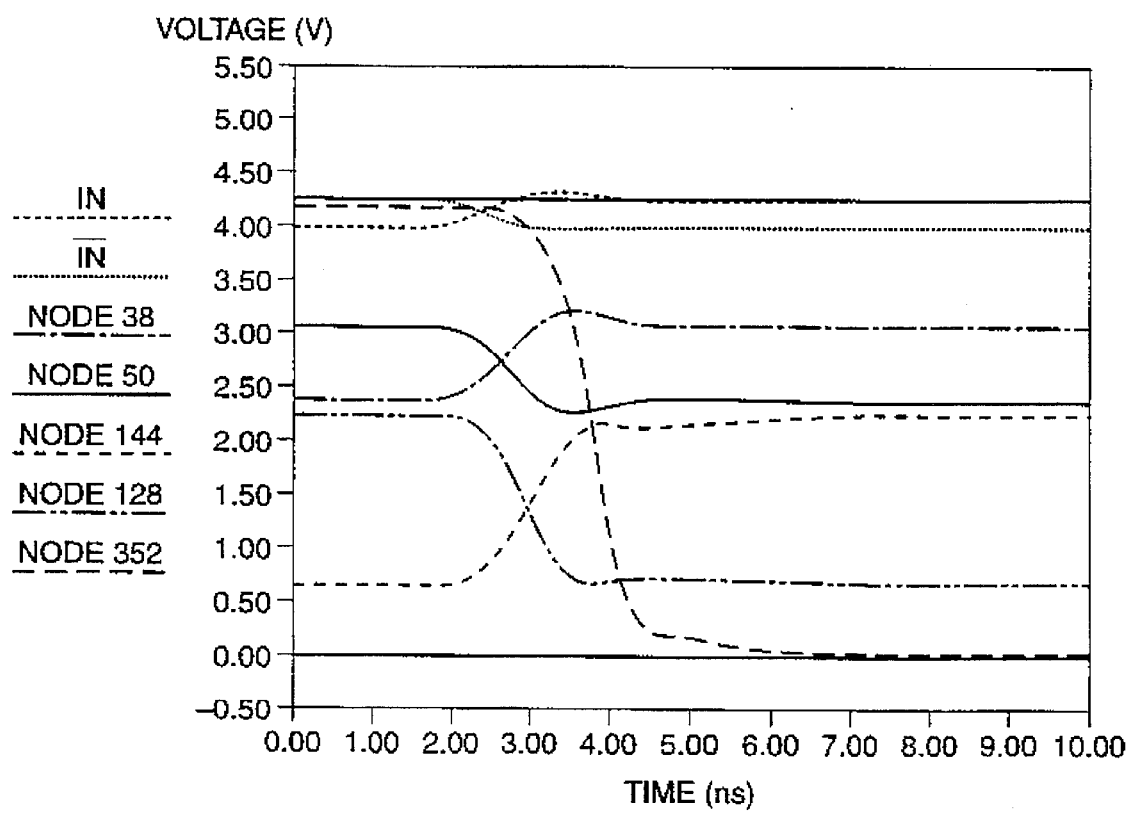
FIG. 3 is a timing diagram illustrating the operation of the circuit shown in FIG. 1.

The operation of the circuit shown in FIG. 1 can be more easily explained in conjunction with FIG. 3. FIG. 3 is a timing diagram illustrating the operation of sense amplifier 10. As shown at time 0.00, assume the $\overline{\text{IN}}$ signal provided to gate 18 of NMOS transistor 14 is initially +4.0 volts and the $\overline{\text{IN}}$ signal provided to gate terminal 24 of NMOS transistor 22 is initially equal to the $V_{cc}$ voltage of +4.25 volts. (In FIG. 3 the $\overline{\text{IN}}$ signal is hidden until about time 2.0 ns under the solid horizontal line.) The input signals are then switched so that the IN signal is +4.25 volts and the $\overline{\text{IN}}$ signal is +4.0 volts. The switching starts at about time 1.5 ns, and the IN and $\overline{\text{IN}}$ signals essentially settle to their new values by about time 3 ns.

The increase in voltage on the gate of transistor 14 (IN) increases the voltage on the source of transistor 14 (node 38). At the same time, the decrease in voltage in the gate of transistor 22 ($\overline{\text{IN}}$) decreases the voltage on the source of transistor 22 (node 50). But an increase in voltage on node 38 increases the current through transistor 70, further decreasing the voltage on node 50. The decrease in the voltage on node 50 causes a decrease in current through transistor 54, allowing a further increase in the voltage on node 38. This positive feedback causes the output nodes 38 and 50 of this first stage of amplifier to exhibit a larger voltage swing than do the input nodes, IN and $\overline{\text{IN}}$. That is, the circuit has a voltage gain greater than unity. Ultimately, the circuit will settle with a +3.1 volt signal at node 38 and a +2.4 volt signal at node 50 (a 700 millivolt difference). Notice that if NMOS transistors 14 and 22 were smaller (narrower) than NMOS transistor 54 and 70, respectively, the positive feedback would exceed unity and the circuit would lock in one state. That is, once in one state, the larger transistor 54 or 70 would maintain node 38 or 50 at a low voltage level, despite the swing in the IN and $\overline{\text{IN}}$ signals. Because transistors 14 and 22 are larger than transistors 54 and 70, respectively, the positive feedback is less than unity, and the circuit does not lock into one state. Rather, the circuit properly responds to the changes in the IN and $\overline{\text{IN}}$ signals. This first stage of the amplifier provides two distinct functions. It provides differential voltage gain with the 250 mV swing on the differential inputs causing a 700 mV swing on the differential outputs. It also provides voltage translation; that is, the common mode voltage of the outputs are about one-third of the $V_{cc}$ below the common mode voltage of the inputs.

The output nodes of the first stage of amplifier, nodes 38 and 50, are input nodes for the second stage of amplifier. That is, the signal at node 38 is provided to gate 132 of NMOS transistor 104, while the signal at node 50 is provided to gate 116 of NMOS transistor 100. Transistors 100, 104, 108, and 112 in the second stage function in the same manner together as transistors 14, 22, 54, and 70 do in the first stage. Ultimately, the voltages at nodes 128 and 144, the outputs of the second stage of the amplifier, settle to +0.70 volts and +2.25 volts, respectively (a 1550 millivolt difference).

As the voltage on node 38 rises by 700 mV (from 2.37 to 3.07 volts in FIG. 3), the voltage on node 144 rises by about 1550 mV (from 0.7 volts to 2.25 volts). Transistor 104 is at or near saturation as will be discussed later. Most of the gate capacitance of a saturated transistor is gate-to-source capacitance and very little capacitance is gate-to-drain capacitance. As the gate node 38 of transistor 104 rises by 700 mV, the source node 144 rises by an even greater amount, 1550 mV, while the drain node 136 is also rising. Therefore, it actually requires a negative charge to raise the gate voltage of transistor 104. That is, the gate, under these bias conditions, actually appears to be a negative capacitance. This negative capacitance effect causes the overshoot of node 38 above its final value (and the undershoot of node 50 below its final value) in FIG. 3, at about 3.5 ns, and significantly contributes to the overall speed of the circuit.

Figure 2:
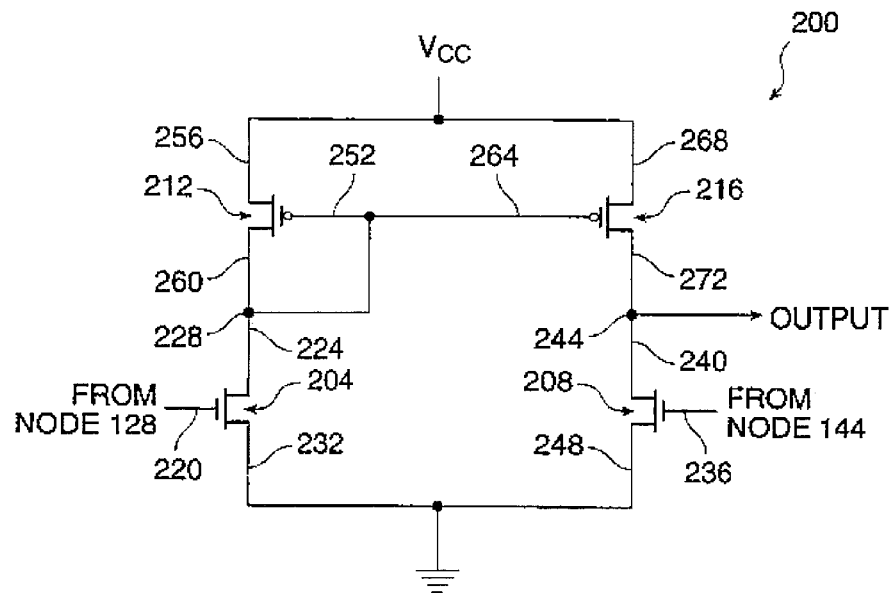
FIG. 2 is a schematic diagram of a known current mirror differential amplifier.

Differential input signals are converted into a single output signal using a current mirror. FIG. 2 illustrates a prior art current mirror which is discussed here before discussion of the current mirror of FIG. 1. FIG. 2 is a schematic diagram of a known current mirror 200 which could be used with sense amplifier 10, but is not used in the preferred embodiment. If this current mirror were used, its input nodes would be the output nodes of the second amplifier stage, nodes 128 and 144. Current mirror 200 includes an NMOS transistor 204, an NMOS transistor 208, a PMOS transistor 212, and a PMOS transistor 216. NMOS transistor 204 has a gate terminal 220 coupled to node 128 (FIG. 1), a first terminal 224 coupled to a node 228, and a second terminal 232 coupled to ground potential. NMOS transistor 208 has a gate terminal 236 coupled to node 144 (FIG. 1), a first terminal 240 coupled to an output node 244, and a second terminal 248 coupled to ground potential. PMOS transistor 212 has a gate terminal 252 coupled to node 228, a first terminal 256 coupled to $V_{cc}$, and a second terminal 260 coupled to node 228. PMOS transistor 216 has a gate terminal 264 coupled to gate terminal 252 of PMOS transistor 212, a first terminal 268 coupled to $V_{cc}$, and a second terminal 272 coupled to output node 244. PMOS transistors 212 and 216 are the same size, perhaps 16 microns wide, and NMOS transistors 204 and 208 are the same size, perhaps 6 microns wide. NMOS transistor 204 conducts current in response to the signal received from node 128. PMOS transistor 212, with gate and drain both connected to node 224, is in saturation and biases itself (that is, its gate voltage) such that its saturation current is exactly equal to the current through NMOS transistor 204. PMOS transistor 216 is the same size as PMOS transistor 212, and is connected to have the same gate and source potentials as saturated PMOS transistor 212. Therefore, PMOS transistor 2 16 tries to maintain a saturation current equal to that of PMOS transistor 212, which current, in turn, is equal to the current through NMOS transistor 204. Thus, PMOS transistor 216 provides a positive current source to pull node 244 toward $V_{cc}$ of an amount equal to the current through NMOS transistor 204. On the other hand, NMOS transistor 208 is the same size as NMOS transistor 204 and draws current away from output node 244 in response to the signal received from node 144, thus attempting to lower the voltage at output node 244. Consequently, if the signal on node 128 is higher than the signal on node 144, PMOS transistor 216 has a higher saturation current than does NMOS transistor 208. Thus, the signal on output node 244 is forced high. If the signal on node 128 is less than the signal on node 144, NMOS transistor 208 has a higher saturation current than does PMOS transistor 216, and the signal on output node 244 is forced low.

When the voltage on node 128 increases, the increased current through transistor 204 causes the voltage on node 228, the drain of transistor 204, to decrease, while the voltage on the source of transistor 204, ground, does not change. Transistor 204 has some gate-to-drain capacitance and substantial gate-to-source capacitance. It therefore requires a substantial (positive) charge to increase the gate potential on transistor 204. The gate of NMOS transistor 204 places a substantial capacitance on node 128, slowing the switching of node 128. Furthermore, whenever node 128 is high, there is substantial current through transistors 204 and 2 12, adding to the total power consumption of the circuit.

In contrast, and with reference to FIG. 1, the sense amplifier 10 avoids both this extra capacitive loading on node 128 and the extra component of power consumption by building the current mirror circuitry (NMOS transistor 204 and PMOS transistor 212 of FIG. 2) into the second stage of the amplifier (existing NMOS transistor 112 and added PMOS transistor 304 of FIG. 1). PMOS transistor 304 has a first terminal 326 coupled to $V_{cc}$, a gate terminal 330 coupled to node 137, and a second terminal 334 coupled to node 137. PMOS transistor 300 has a first terminal 314 coupled to $V_{cc}$, a gate terminal 318 coupled to node 122, and a second terminal 322 coupled to node 122. PMOS transistor 300 is not required for proper operation of the circuit, but is included to create symmetry in the second stage of the amplifier. If PMOS transistor 300 were not included, node 122 would be connected directly to $V_{cc}$. PMOS transistor 308 has a first terminal 340 coupled to $V_{cc}$, a gate terminal 344 coupled to gate 330 of PMOS transistor 304, and a second terminal 348 coupled to an output node 352. In the preferred embodiment, the width of PMOS transistor 308 is equal to the width of PMOS transistor 304, both being at least 16 microns wide. NMOS transistor 310 has a first terminal 356 coupled to output node 352, a gate terminal 360 coupled to node 144, and a second terminal 364 coupled to the ground potential. In the preferred embodiment, NMOS transistor 310 is the same width as NMOS transistor 112, 6 microns. In some applications, it may be desirable to make transistors 308 and 310 larger than transistors 304 and 112. In this event, what is important is to make the width of PMOS transistor 308 divided by the width of PMOS transistor 304 equal to the width of NMOS transistor 310 divided by the width of NMOS transistor 112. Thus, if transistor 308 is twice the width of transistor 304, then transistor 310 should also be twice the width of transistor 312. This doubles the currents through both transistors 308 and 310, but maintains the ratio of these currents.

To understand the operation of this current mirror integrated into the second stage of the amplifier, assume node 128 is initially at +2.25 volts and node 144 is initially at +0.70 volts. The +2.25 volts applied to gate 162 of NMOS transistor 112 causes a certain current to flow through transistor 112 and therefore also through NMOS transistor 104 and through saturated PMOS transistor 304. This is essentially the same current that would flow through PMOS transistor 212 of FIG. 2 in a prior art implementation, assuming NMOS transistor 204 of FIG. 2 is the same size as NMOS transistor 112 of FIG. 1. PMOS transistor 308 has both its source and gate terminals biased to the same potentials as does PMOS transistor 304, and is the same size as PMOS transistor 304, so the saturation current through PMOS transistor 308 will equal the current through PMOS transistor 304 and through NMOS transistor 112. This current tends to raise the voltage at output node 352. On the other hand, the +0.7 volt signal at node 144 tends to turn off transistor 310, because the signal level is essentially the threshold voltage of a typical NMOS transistor. Thus, very little current flows through NMOS transistor 310, and PMOS transistor 308 pulls the output node 352 to or very near to the $V_{cc}$ potential, with little or no current through transistors 308 and 310. In FIG. 3, the output at node 352 is at about 4.20 volts before the inputs switch.

When the voltage at node 128 swings down to +0.7 volts and the voltage at node 144 swings up to +2.25 volts, then NMOS transistor 112 conducts little current, and an equally small amount of current flows through PMOS transistor 304. The same small amount of current flows through PMOS transistor 308. Meanwhile, NMOS transistor 310 is turned on by the relatively high gate voltage of 2.25 volts, thus forcing output node 352 low. In FIG. 3, the output at node 352 is below 0.05 volts in the steady state condition between 8 and 10 ns. Again, there is little current through transistors 308 and 310; this time being limited by the low saturated current of PMOS transistor 308.

The second stage of the amplifier works best if NMOS transistor 104 remains in saturation. This requires that the voltage on the drain of transistor 104, less one NMOS threshold voltage, exceeds the voltage on the gate of transistor 104. That is, the voltage on node 137 must be within one NMOS $V_T$ of the voltage on node 38. However, PMOS transistor 304 requires its gate voltage to be at least one PMOS transistor threshold voltage below its source voltage before conduction occurs. Thus, the voltage on node 137 will be at least one PMOS threshold voltage below the $V_{cc}$ potential. To maintain saturation of transistor 104, its drain voltage is kept as high as possible while its gate voltage is kept relatively low. To keep node 137 high, PMOS transistor 304 is relatively wide, 16 microns wide in the preferred embodiment. The first stage of the amplifier is included to provide voltage gain and to keep node 38 low. As discussed earlier, the common mode voltage on node 38 is one-third of $V_{cc}$ below the input voltage, IN. The low voltage on node 38 combined with the high voltage on node 137 assure saturated operation of transistor 104. Similarly, transistor 100 remains in saturation.

In an application in which the inputs are somewhat lower in voltage, and in which the voltage gain of the first stage of the amplifier is not deemed necessary, the second stage may be used as a first stage with the current mirror integrated into this stage. In this case, transistors 14, 22, 54, 70, and 86 are deleted, and the inputs to the circuit would go directly to the gate terminals 116 and 132 of transistors 100 and 104.

Incorporating PMOS transistor 304 into the last normal stage of sense amplifier 10 eliminates the current consumed by PMOS transistor 212 and NMOS transistor 204 of prior art devices, instead using the current already necessary and present in the last normal stage of the amplifier. Very little current flows from $V_{cc}$ to ground through transistors 308 and 310 to produce the output signal. Consequently, a current mirror constructed according to the present invention consumes very low power. Furthermore, it speeds up the circuit by decreasing the capacitive loading on node 128, eliminating the need for a separate transistor 204 of FIG. 2.

While the above is a complete description of a preferred embodiment of the present invention, various modifications may be employed. Consequently, the scope of the invention should be ascertained from the claims.

I claim:

1. An amplifier comprising:
    a first transistor having a control terminal for receiving a first input signal, a first terminal coupled to a first potential source, and a second terminal;
    a second transistor having a control terminal for receiving a second input signal, a first terminal coupled to the potential source, and a second terminal;
    a third transistor having a control terminal coupled to the second terminal of the second transistor, a first terminal coupled to the second terminal of the first transistor, and a second terminal;
    a fourth transistor having a control terminal coupled to the second terminal of the first transistor, a first terminal coupled to the second terminal of the second transistor, and a second terminal coupled to the second terminal of the third transistor;
    a fifth transistor having a control terminal coupled to the second terminal of the third transistor, a first terminal coupled to the second terminal of the third transistor and a second terminal coupled to a second potential source;
    wherein the first transistor has a greater current carrying capacity than the third transistor and the second transistor has a greater current carrying capacity than the fourth transistor.

2. The circuit according to claim 1 wherein the first, second, third, fourth, and fifth transistors each comprise a field effect transistor, and wherein the first transistor has a greater channel width than the third transistor and the second transistor has a greater channel width than the fourth transistor.

3. The circuit according to claim 2 wherein the first, second, third, and fourth transistors each comprise an NMOS transistor.

4. The circuit according to claim 1 wherein the fifth transistor biases the amplifier so that a common mode voltage of the amplifier at the second terminals of the first and second transistors is approximately equal to the voltage on the second potential source plus two-thirds of the voltage on the first potential source.

5. The circuit according to claim 4 wherein the first, second, third, and fourth transistors each comprise a field effect transistor, and wherein the first transistor has a greater channel width than the third transistor and wherein the second transistor has a greater channel width than the fourth transistor.

6. The circuit according to claim 5 wherein the fifth transistor comprises a field effect transistor having a channel width approximately as large as the channel widths of the third and fourth transistors added together.

7. The circuit according to claim 6 wherein the first, second, third, fourth, and fifth transistors each comprise an NMOS transistor.

8. An amplifier circuit comprising:
    a first amplifier stage including:
        a first transistor having a control terminal for receiving a first input signal, a first terminal coupled to a first potential source, and a second terminal;
        a second transistor having a control terminal for receiving a second input signal, a first terminal coupled to the first potential and a second terminal;
        a third transistor having a control terminal coupled to the second terminal of the second transistor, a first terminal coupled to the second terminal of the first transistor, and a second terminal;
        a fourth transistor having a control terminal coupled to the second terminal of the first transistor, a first terminal coupled to the second terminal of the second transistor, and a second terminal;
        wherein the first transistor has a greater current carrying capacity than the third transistor and wherein the second transistor has a greater current carrying capacity than the fourth transistor;
        biasing means, coupled to the second terminals of the third and fourth transistors and to a second potential source, for biasing the first amplifier stage so that a common mode voltage of the amplifier at the second terminals of the first and second transistors is approximately equal to the voltage of the second potential plus two-thirds of the common mode voltages on the input signals;
    a second amplifier stage including:
        a fifth transistor having a control terminal coupled to the second terminal of the second transistor, a first terminal coupled to a current source, and a second terminal;
        a sixth transistor having a control terminal coupled to the second terminal of the first transistor, a first terminal coupled to a current source, and a second terminal;

a seventh transistor having a control terminal coupled to the second terminal of the sixth transistor, a first terminal coupled to the second terminal of the fifth transistor, and a second terminal coupled to the second potential source;

an eighth transistor having a control terminal coupled to the second terminal of the fifth transistor, a first terminal coupled to the second terminal of the sixth transistor, and a second terminal coupled to the second potential source; and wherein the fifth transistor has a greater current carrying capacity than the seventh transistor and the sixth transistor has a greater current carrying capacity than the eighth transistor.

9. The circuit according to claim 8 wherein the biasing means comprises a ninth transistor having a control terminal connected to the second terminals of the third and fourth transistors, a first terminal connected to the control terminal and a second terminal connected to the second potential source.

10. The circuit according to claim 9 wherein the first, second, third, fourth, fifth, sixth, seventh, eighth and ninth transistors each comprise a field effect transistor, wherein the first transistor has a greater channel width than the third transistor, and wherein the second transistor has a greater channel width than the fourth transistor, and wherein the fifth transistor has a greater channel width than the seventh transistor and wherein the sixth transistor has a greater channel width than the eighth transistor.

11. The circuit according to claim 10 wherein the ninth transistor comprises a field effect transistor having a channel width approximately as large as the channel widths of the third and fourth transistors added together.

12. The circuit according to claim 11 wherein the first, second, third, fourth, fifth, sixth, seventh, eighth, and ninth transistors each comprise an NMOS transistor.

13. The circuit according to claim 8 further comprising output signal means, coupled to the second amplifier stage, for providing a first signal at an output node when a voltage at the second terminal of the fifth transistor is greater than a voltage at the second terminal of the sixth transistor and for providing a second signal at the output node when the voltage at the second terminal of the fifth transistor is less than the voltage at the second terminal of the sixth transistor.

14. The circuit according to claim 13 wherein the output means has a first input terminal coupled to the first terminal of the sixth transistor and a second input terminal coupled to the second terminal of the sixth transistor.

15. The circuit according to claim 14 wherein the output means comprises:

a tenth transistor having a control terminal coupled to the first terminal of the sixth transistor, a first terminal coupled to the first potential source, and a second terminal coupled to the output node; and an eleventh transistor having a control terminal coupled to the second terminal of the sixth transistor, a first terminal coupled to the output node, and a second terminal coupled to the second potential source.

16. The circuit according to claim 15 wherein the output means further comprises a twelfth transistor having a control terminal coupled to the first terminal of the sixth transistor, a first terminal coupled to the first potential source, and a second terminal coupled to the first terminal of the sixth transistor.

17. The circuit according to claim 16 wherein the first, second, third, fourth, fifth, sixth, seventh, and eighth transistors each comprise a field effect transistor, wherein the first transistor has a greater channel width than the third transistor, and wherein the second transistor has a greater channel width than the fourth transistor, and wherein the fifth transistor has a greater channel width than the seventh transistor, and wherein the sixth transistor has a greater channel width than the eighth transistor.

18. The circuit according to claim 17 wherein the ninth transistor comprises a field effect transistor having a channel width approximately equal to the sum of the channel widths of the third and fourth transistors.

19. The circuit according to claim 16 wherein the first, second, third, fourth, fifth, sixth, seventh, eighth, and eleventh transistors each comprise an NMOS transistor.

20. The circuit according to claim 19 wherein the tenth, and twelfth transistors each comprise a PMOS transistor.

21. The circuit according to claim 20 wherein the ninth transistor comprises an NMOS transistor.

22. The circuit according to claim 18 wherein the output means further comprises a thirteenth transistor having a control terminal coupled to the first terminal of the fifth transistor, a first terminal coupled to the first potential source, and a second terminal coupled to the first terminal of the fifth transistor.

23. The circuit according to claim 16 wherein the first, second, third, fourth, fifth, sixth, seventh, eighth, and eleventh transistors each comprise a PMOS transistor.

24. The circuit according to claim 23 wherein the tenth and twelfth transistors each comprise a NMOS transistor.

25. The circuit according to claim 24 wherein the ninth transistor comprises a PMOS transistor.

26. An amplifier comprising:

a first transistor having a control terminal for receiving a first input signal, a first terminal, and a second terminal;

a second transistor having a control terminal for receiving a second input signal, a first terminal and a second terminal;

a third transistor having a control terminal coupled to the second terminal of the second transistor, a first terminal coupled to the second terminal of the first transistor and a second terminal coupled to a first potential source;

a fourth transistor having a control terminal coupled to the second terminal of the first transistor, a first terminal coupled to the second terminal of the second transistor and a second terminal coupled to the first potential source;

a fifth transistor having a control terminal, a first terminal coupled to a second potential source and a second terminal coupled to an output node;

a sixth transistor having a control terminal, a first terminal coupled to the output node, and a second terminal coupled to the first potential source;

wherein the control terminal of the fifth transistor is coupled to the first terminal of the second transistor and the control terminal of the sixth transistor is coupled to the second terminal of the second transistor.

27. The circuit according to claim 26 wherein the first, second, third, fourth, and sixth transistors are NMOS transistors.

28. The circuit according to claim 27 wherein the first, second, third, fourth, and sixth transistors are NMOS transistors.

29. The circuit according to claim 28 wherein the fifth transistor is a PMOS transistor.

30. The circuit according to claim 26 further comprising a seventh transistor having a control terminal coupled to the first terminal of the second transistor, a first terminal coupled to the second potential source and a second terminal coupled to the first terminal of the second transistor.

31. The circuit according to claim 30 wherein the first, second, third, fourth, and sixth transistors are NMOS transistors and the fifth and seventh transistors are PMOS transistors.

32. The circuit according to claim 30 wherein the first terminal of the first transistor is coupled to the second potential source.

33. The circuit according to claim 30 further comprising an eighth transistor having a control terminal coupled to the first terminal of the first transistor, a first terminal coupled to the second potential source and a second terminal coupled to the first terminal of the first transistor.

34. The circuit according to claim 33 wherein the first, second third, fourth, and sixth transistors are NMOS transistors and the fifth, seventh, and eight transistors are PMOS transistors.

35. The circuit according to claim 30 wherein the first transistor has a greater channel width than the third transistor and the second transistor has a greater channel width than the fourth transistor.

36. The circuit according to claim 30 wherein the sixth transistor has the channel width as the fourth transistor, and the seventh transistor has the same channel width as the fifth transistor.

37. The circuit according to claim 35 wherein the sixth transistor has the same channel width as the fourth transistor, and the seventh transistor has the same channel width as the fifth transistor.

38. The circuit according to claim 30 wherein the ratio of the channel widths of the sixth to the fourth transistors is the same as the ratio of the channel widths of the seventh to the fifth transistors.

39. The circuit according to claim 35 wherein the ratio of the channel widths of the sixth to the fourth transistors is the same as the ratio of the channel widths of the seventh to the fifth transistors.

* * * * *